United States Patent
Chinnusamy et al.

(10) Patent No.: US 10,153,248 B2
(45) Date of Patent: Dec. 11, 2018

(54) SEMICONDUCTOR DEVICE AND METHOD OF FORMING INSULATING LAYERS AROUND SEMICONDUCTOR DIE

(71) Applicant: Semtech Corporation, Camarillo, CA (US)

(72) Inventors: Satyamoorthi Chinnusamy, San Jose, CA (US); Kevin Simpson, Colorado Springs, CO (US); Mark C. Costello, Fillmore, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 15/797,712

(22) Filed: Oct. 30, 2017

(65) Prior Publication Data

US 2018/0068976 A1    Mar. 8, 2018

Related U.S. Application Data

(63) Continuation of application No. 15/055,264, filed on Feb. 26, 2016, now Pat. No. 9,837,375.

(51) Int. Cl.
    *H01L 21/56*     (2006.01)
    *H01L 23/31*     (2006.01)
    (Continued)

(52) U.S. Cl.
    CPC ............ *H01L 24/94* (2013.01); *H01L 21/561* (2013.01); *H01L 21/565* (2013.01); *H01L 21/78* (2013.01);
    (Continued)

(58) Field of Classification Search
    CPC ..................................................... H01L 21/768
    (Continued)

(56) References Cited

U.S. PATENT DOCUMENTS

2009/0294899 A1   12/2009   Pagaila et al.
2009/0294914 A1   12/2009   Pagaila
(Continued)

FOREIGN PATENT DOCUMENTS

CN     104201114 A     12/2014
CN     105304585 A     2/2016
(Continued)

*Primary Examiner* — Moazzam Hossain
*Assistant Examiner* — Omar Mojaddedi
(74) *Attorney, Agent, or Firm* — Brian M. Kaufman; Robert D. Atkins; Patent Law Group: Atkins and Associates, P.C.

(57) ABSTRACT

A semiconductor device has a semiconductor wafer including a plurality of semiconductor die and a plurality of contact pads formed over a first surface of the semiconductor wafer. A trench is formed partially through the first surface of the semiconductor wafer. An insulating material is disposed over the first surface of the semiconductor wafer and into the trench. A conductive layer is formed over the contact pads. The conductive layer can be printed to extend over the insulating material in the trench between adjacent contact pads. A portion of the semiconductor wafer opposite the first surface of the semiconductor wafer is removed to the insulating material in the trench. An insulating layer is formed over a second surface of the semiconductor wafer and side surfaces of the semiconductor wafer. The semiconductor wafer is singulated through the insulating material in the first trench to separate the semiconductor die.

23 Claims, 18 Drawing Sheets

(51) Int. Cl.
*H01L 23/00* (2006.01)
*H01L 21/78* (2006.01)

(52) U.S. Cl.
CPC ...... *H01L 23/3107* (2013.01); *H01L 23/3114* (2013.01); *H01L 24/03* (2013.01); *H01L 24/06* (2013.01); *H01L 21/568* (2013.01); *H01L 2224/0331* (2013.01); *H01L 2224/04105* (2013.01); *H01L 2224/05561* (2013.01); *H01L 2224/94* (2013.01)

(58) Field of Classification Search
USPC .......................................................... 438/113
See application file for complete search history.

(56) References Cited

U.S. PATENT DOCUMENTS

| | | | |
|---|---|---|---|
| 2010/0096731 A1* | 4/2010 | Do | H01L 21/568 257/620 |
| 2010/0230822 A1 | 9/2010 | Pagaila et al. | |
| 2010/0311224 A1 | 12/2010 | Kurosawa et al. | |
| 2010/0317153 A1 | 12/2010 | Do et al. | |
| 2012/0018900 A1* | 1/2012 | Pagaila | H01L 21/56 257/774 |
| 2014/0264817 A1* | 9/2014 | Lee | H01L 25/50 257/712 |
| 2016/0042998 A1* | 2/2016 | Pueschner | H01L 21/302 438/114 |

FOREIGN PATENT DOCUMENTS

| | | | |
|---|---|---|---|
| JP | 2010283204 A | 12/2010 | |
| JP | 2011210925 A | 10/2011 | |

\* cited by examiner

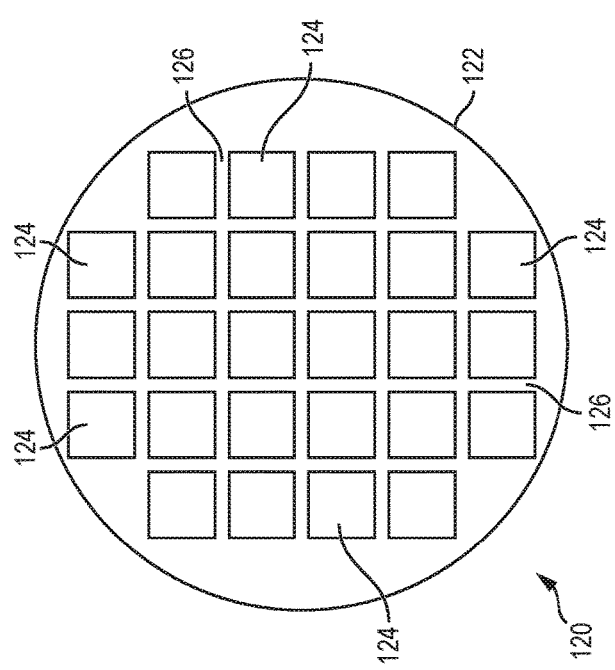
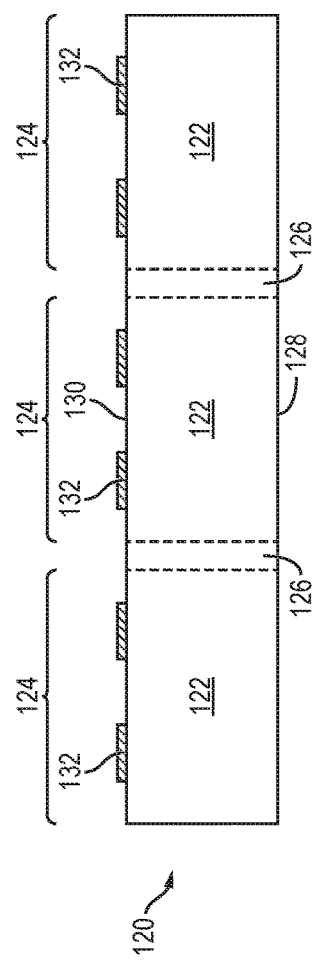

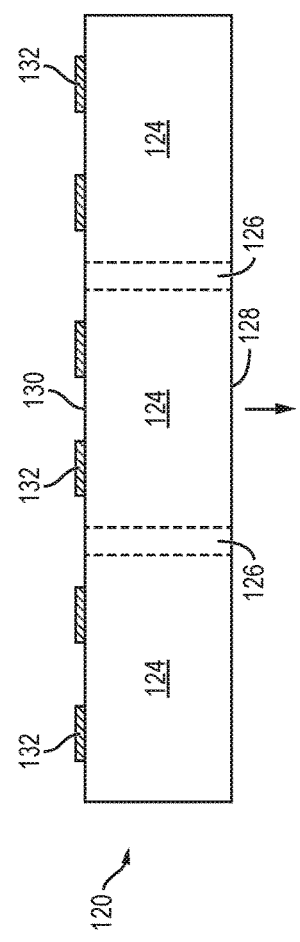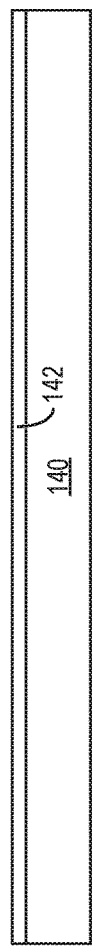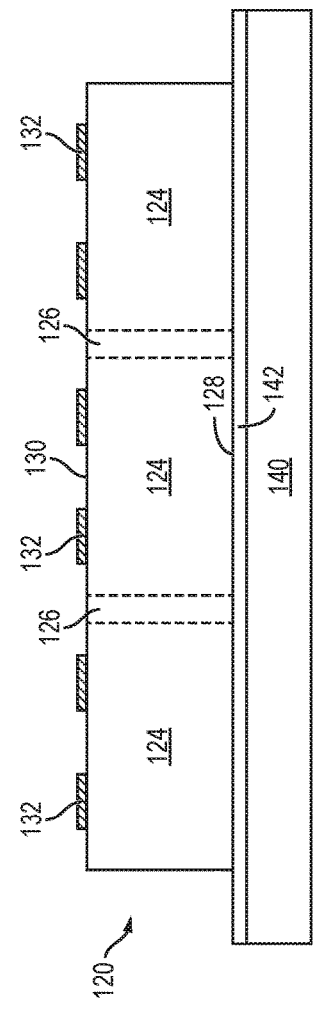

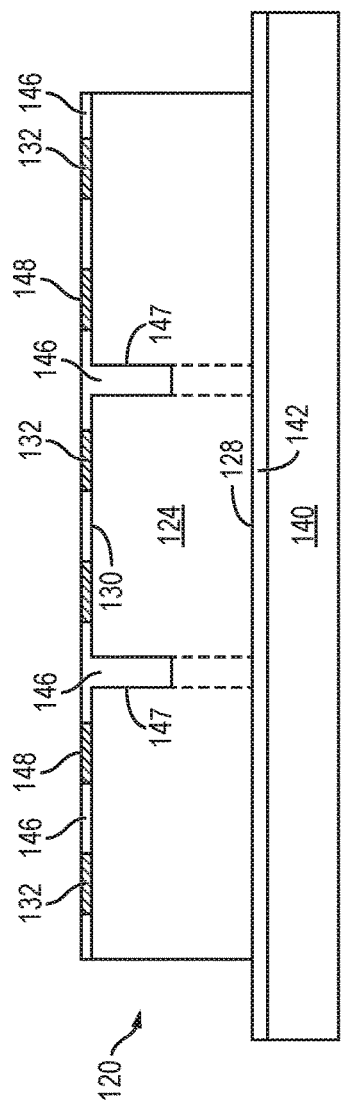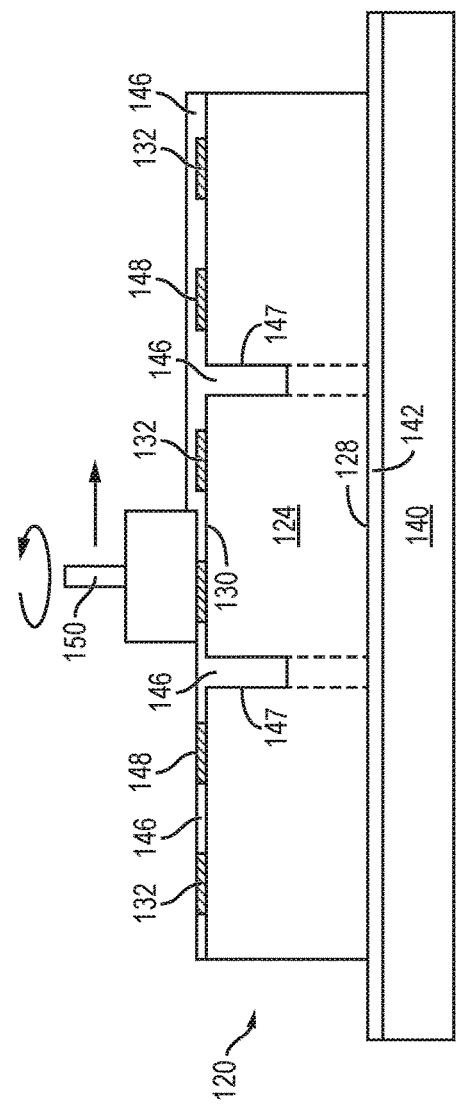

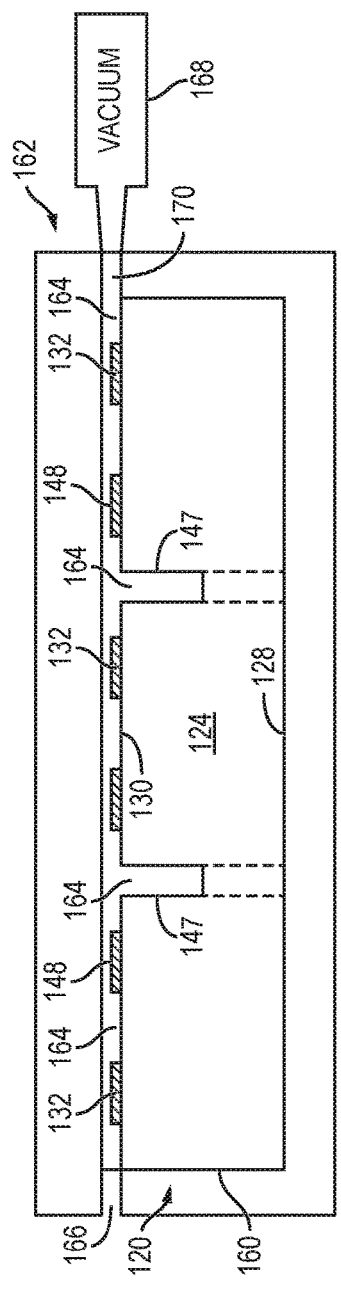
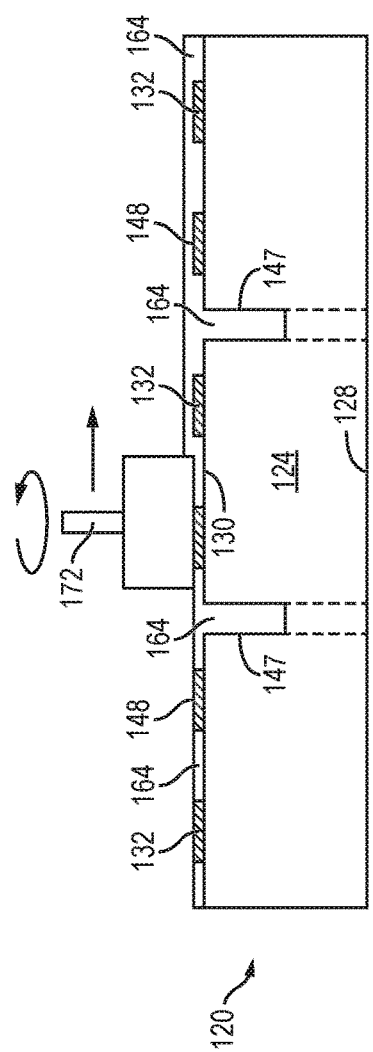

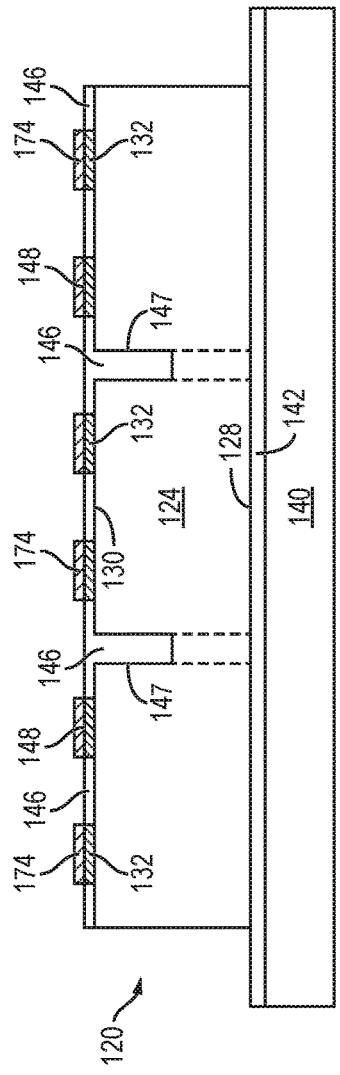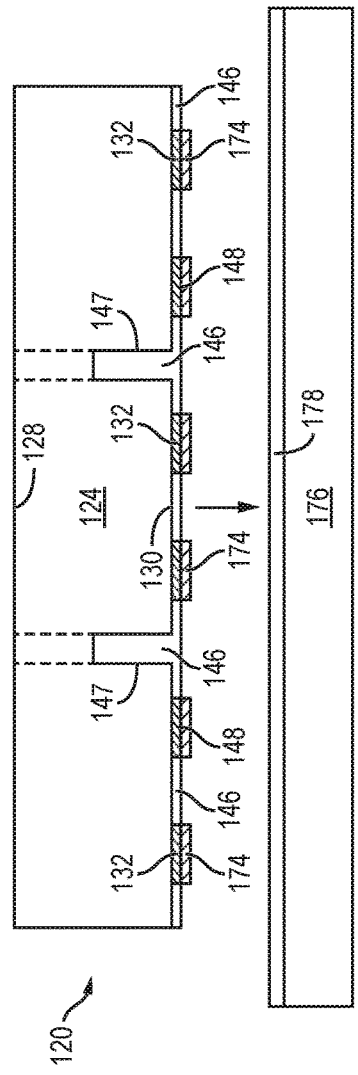

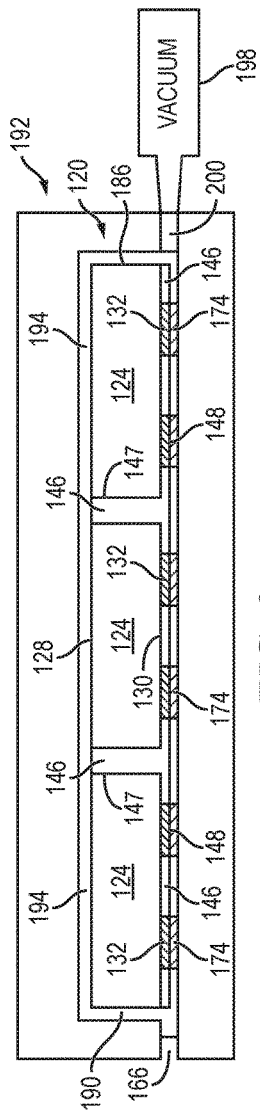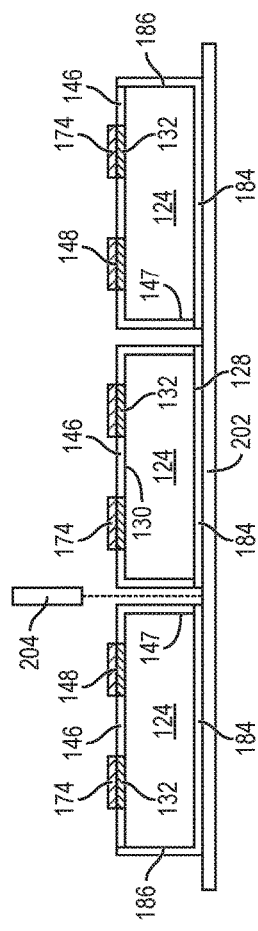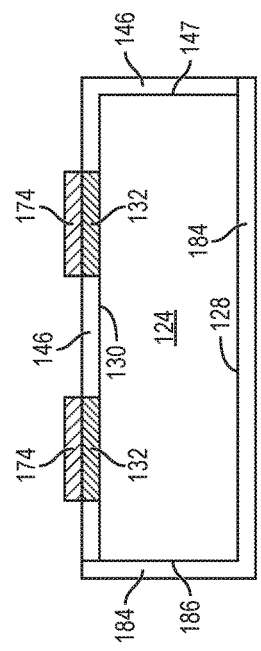

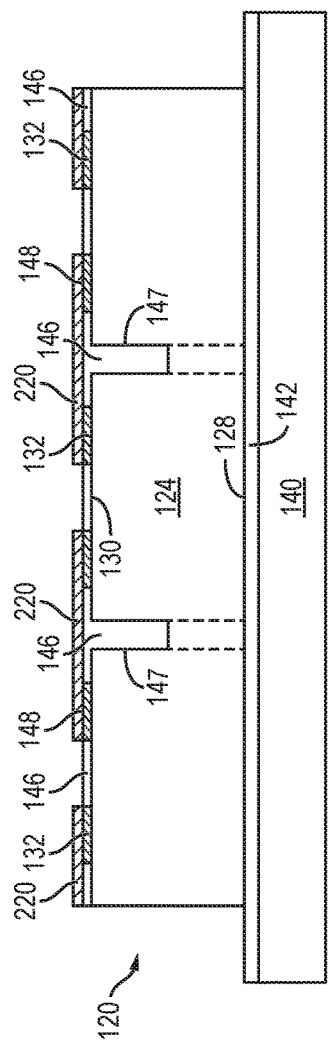
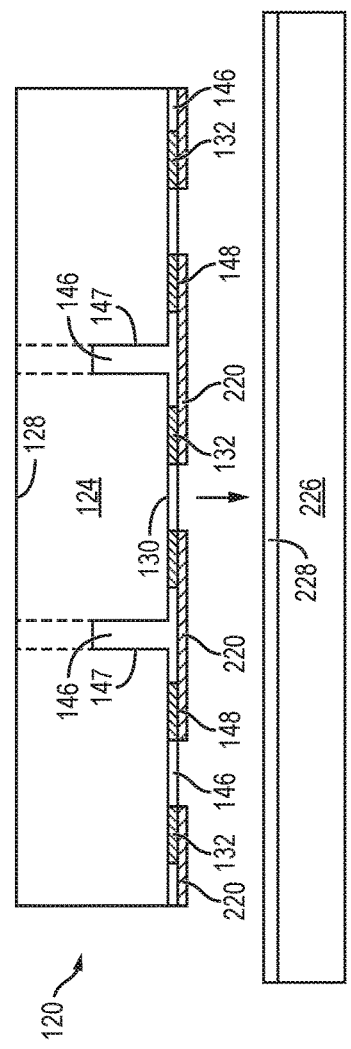

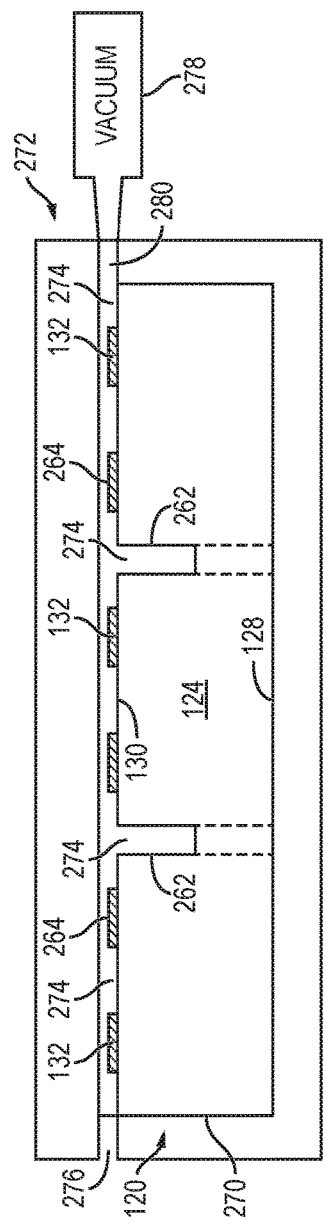
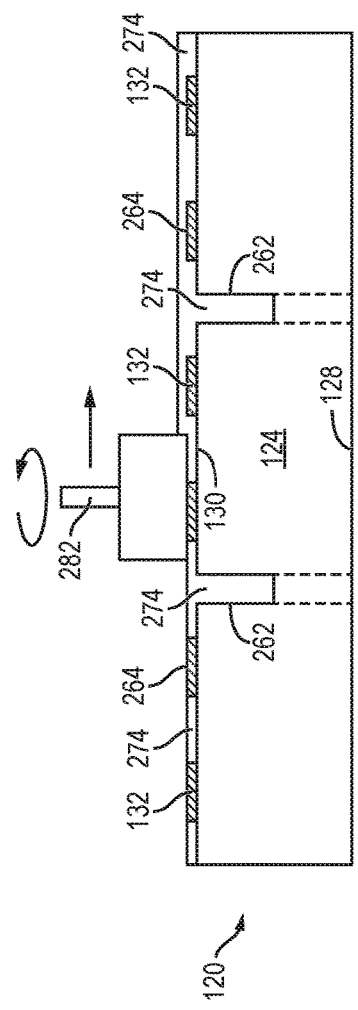

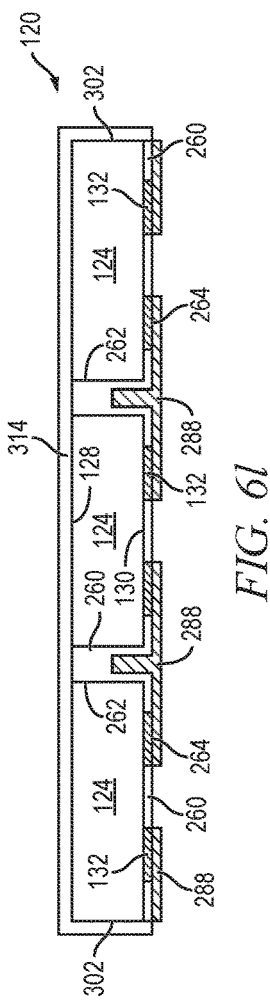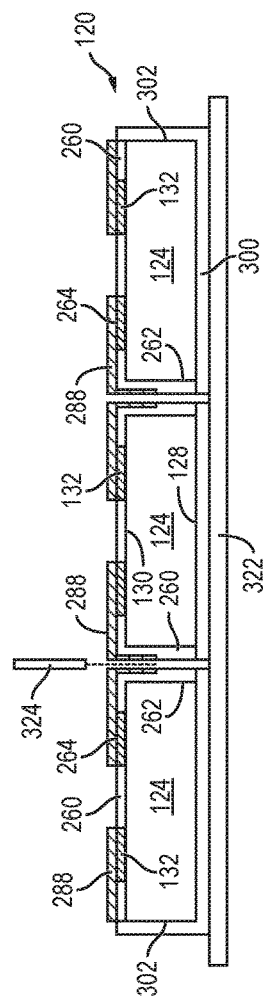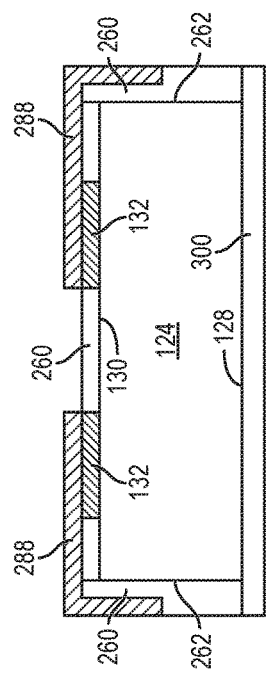

SEMICONDUCTOR DEVICE AND METHOD OF FORMING INSULATING LAYERS AROUND SEMICONDUCTOR DIE

CLAIM TO DOMESTIC PRIORITY

The present application is a continuation of U.S. patent application Ser. No. 15/055,264, now U.S. Pat. No. 9,837,375, filed Feb. 26, 2016, which application is incorporated herein by reference.

FIELD OF THE INVENTION

The present invention relates in general to semiconductor devices and, more particularly, to a semiconductor device and method of forming insulating layers around a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving many steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation.

One goal of semiconductor manufacturing is to protect the semiconductor die from external environmental elements, such as moisture, contaminants, and light. An encapsulant or molding compound is often applied over the semiconductor die. One or more surfaces of the semiconductor die, particularly in a flipchip configuration, may still be exposed to the external environmental elements.

BRIEF DESCRIPTION OF THE DRAWINGS

FIG. 3 illustrates a semiconductor die from the process flow of FIGS. 2a-2q;

FIGS. 4a-4g illustrate another process of forming insulating material around a semiconductor wafer having conductive printing;

FIGS. 6a-6m illustrate another process of forming insulating material around a semiconductor wafer with a conductive layer on side surfaces of the semiconductor die; and FIG. 7 illustrates a semiconductor die from the process flow of FIGS. 6a-6m.

DETAILED DESCRIPTION OF THE DRAWINGS

Figure 1:
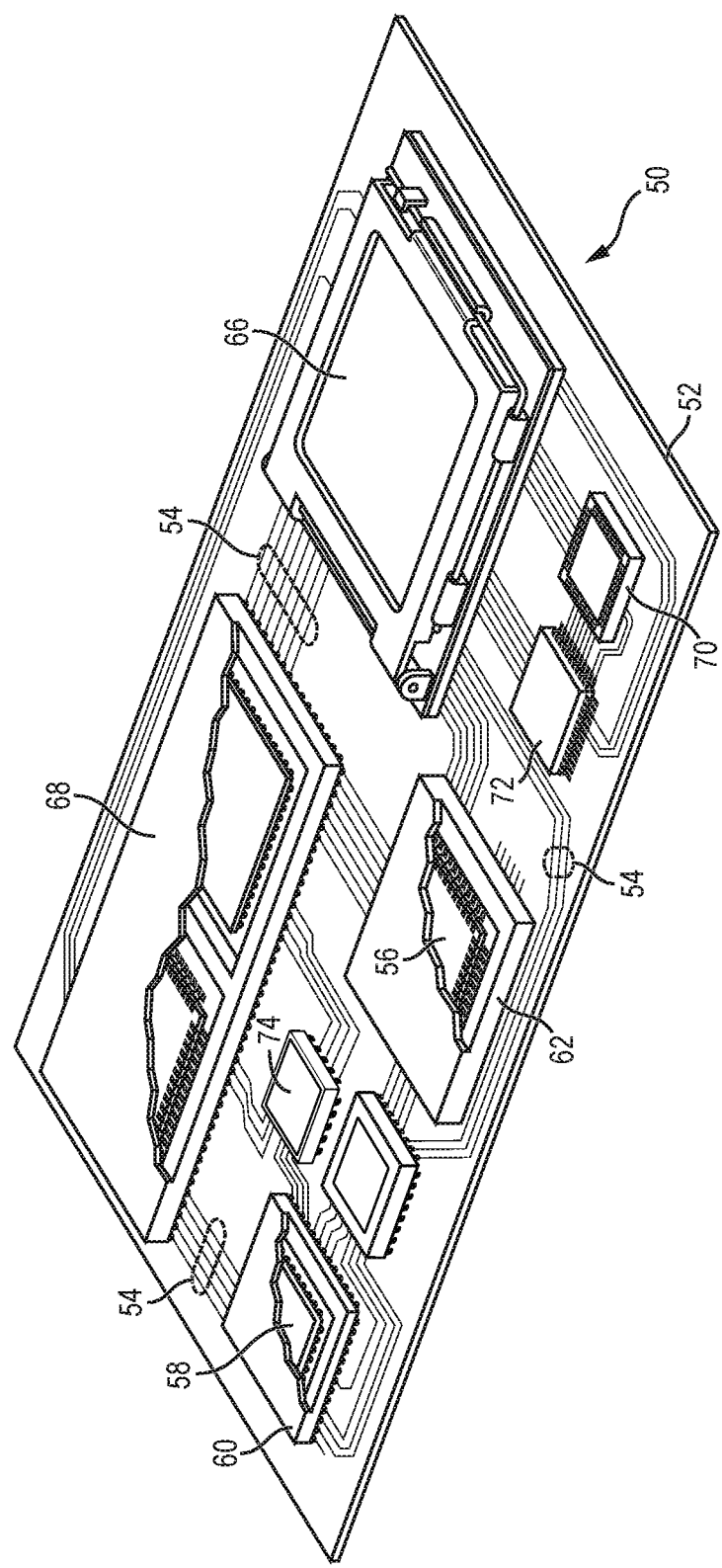
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of semiconductor die on the surface of a semiconductor wafer. Each semiconductor die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions. The term "semiconductor die" as used herein refers to both the singular and plural form of the words, and accordingly, can refer to both a single semiconductor device and multiple semiconductor devices.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is cut along non-functional regions of the wafer called saw streets or scribe lines using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, and flipchip 74 are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area, scribe lines, or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm) and thickness of 700 micrometers (μm). In another embodiment, semiconductor wafer 120 has a width or diameter of 100-450 mm.

FIG. 2b shows a cross-sectional view of a portion of semiconductor wafer 120. Semiconductor wafer 120, and each semiconductor die 124, has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), silver (Ag), titanium (Ti), or other suitable electrically conductive material. In one embodiment, conductive layer 132 is Ni formed over Al by electroless deposition or electroplating. Other metal layers can also be used to form conductive layer 132. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

FIG. 2c shows a cross-sectional view of a portion of a carrier or temporary substrate 140 containing sacrificial base material such as silicon, polymer, beryllium oxide, glass, or other suitable low-cost, rigid material for structural support. An interface layer or double-sided tape 142 is formed over carrier 140 as a temporary adhesive bonding film, etch-stop layer, or thermal release layer. Semiconductor wafer 120 is positioned over and mounted to carrier 140 and interface layer 142 with active surface 130 and conductive layer 132 oriented away from the carrier. FIG. 2d shows semiconductor wafer 120 mounted to interface layer 142 of carrier 140.

Figure 2E:
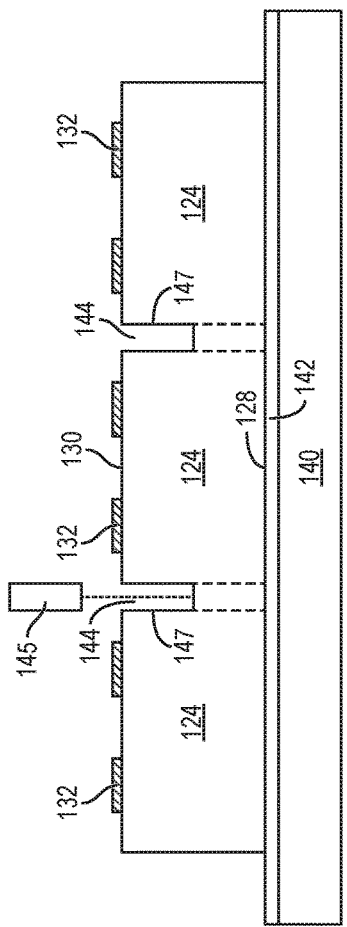
FIGS. 2a-2q illustrate a process of forming insulating material around a semiconductor wafer.
Figure 2F:
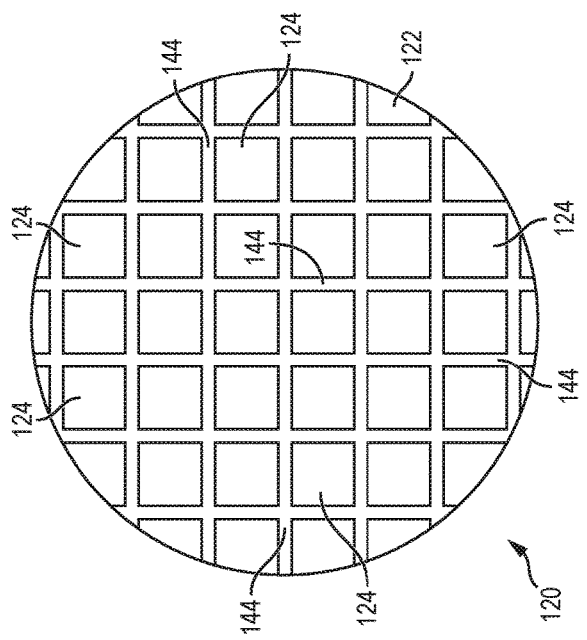

In FIG. 2e, a trench 144 is formed in a surface of semiconductor wafer 120 along saw streets 126 partially but not completely through semiconductor wafer 120 using a saw blade or laser cutting tool 145, deep reactive ion etching (DRIE), or other suitable cutting process. In one embodiment, trench 144 has a depth of 210 µm for the 700 µm thickness of semiconductor wafer 120. Alternatively, trench 144 has a depth of 0.25-0.50 of the thickness of semiconductor wafer 120. FIG. 2f shows a plan view of trench 144 formed in semiconductor wafer 120 along saw streets 126. Semiconductor wafer 120 is pretreated with plasma etch or chemical etch to enhance adhesion of later-applied insulating material or encapsulant. An oxide deposition can be applied to semiconductor wafer 120 that requires second level metal termination.

In FIG. 2g, trench 144 is filled with an insulating material 146, such as an epoxy or polymer material. Insulating material 146 covers side surfaces 147 of semiconductor die 124 in trench 144 and further forms a layer over active surface 130. In another embodiment, insulating material 146 can be silicon dioxide (SiO2), silicon nitride (Si3N4), silicon oxynitride (SiON), tantalum pentoxide (Ta2O5), aluminum oxide (Al2O3), or other material having similar insulating and structural properties. The layer of insulating material 146 extends to surface 148 of conductive layer 132, leaving surface 148 exposed, as shown in FIG. 2g. Insulating material 146 is cured to solidify and bond to active surface 130 and side surfaces 147 of semiconductor die 124.

In another embodiment, the layer of insulating material 146 is sufficiently thick to cover surface 148 of conductive layer 132, as shown in FIG. 2h. In this case, grinder 150 removes excess insulating material 146 to planarize the insulating material and expose surface 148 of conductive layer 132.

In another embodiment, instead of applying insulating material 146 in FIG. 2g or 2h, semiconductor wafer 120 is removed from carrier 140 and placed in cavity 160 of chase mold 162, as shown in FIG. 2i. A volume of encapsulant or molding compound 164 is injected into cavity 160, e.g., through inlet 166, under an elevated temperature and pressure over active surface 130 and into trench 144 of semiconductor wafer 120. A vacuum 168 is drawn on port 170 during an auto-mold process to achieve an evenly dispersed, uniformly distributed, substantially void free encapsulant 164. Alternatively, semiconductor wafer 120 is compression molded with encapsulant 164 in chase mold 162 with vacuum assist. Encapsulant 164 can be a polymer composite material, such as epoxy resin with filler, epoxy acrylate with filler, or polymer with proper filler. Encapsulant 164 is non-conductive, provides physical support, and environmentally protects semiconductor die 124 from external elements, contaminants, and moisture. Encapsulant 164 also protects semiconductor die 124 from degradation due to exposure to light. Semiconductor wafer 120 is removed from chase mold 162 with encapsulant 164 disposed over active surface 130 and into trench 144 of semiconductor wafer 120. In FIG. 2j, grinder 172 removes excess encapsulant 164 to planarize the encapsulant and expose surface 148 of conductive layer 132.

Accordingly, the insulating material disposed over active surface 130 and into trench 144 can be insulating material 146 as in FIG. 2g or 2h, or encapsulant 164 as in FIG. 2j. The following description is provided in terms of insulating material 146 but also applies to the embodiment with encapsulant 164. Returning to FIG. 2h, surface 148 of conductive layer 132 is cleaned, and an electrically conductive layer 174 is formed over surface 148 of conductive layer 132 using PVD, CVD, electrolytic plating, electroless plating process, or other suitable metal deposition process, as shown in FIG. 2k. Conductive layer 174 can be one or more layers of Al, Cu, Sn, Ni, Au, Ag, Ti, SnAg, SnAgCu, CuNi, CuNiAu, CuSnAg, CuNiPdAu, or other suitable electrically conductive material. In one embodiment, conductive layer 174 is Ni, Au, or Ni/Au alloy. Conductive layer 174 extends above insulating material 146 or encapsulant 164 and inhibits oxidation of conductive layer 132.

In FIG. 2l, carrier 140 and interface layer 142 are removed by chemical etching, mechanical peeling, chemical mechanical planarization (CMP), mechanical grinding, thermal bake, UV light, laser scanning, or wet stripping. FIG. 2l further shows a cross-sectional view of a portion of a carrier or temporary substrate 176 containing sacrificial base material such as silicon, polymer, beryllium oxide, glass, or other suitable low-cost, rigid material for structural support. An interface layer or double-sided tape 178 is formed over carrier 176 as a temporary adhesive bonding film, etch-stop layer, or thermal release layer. Semiconductor wafer 120 is positioned over and mounted to interface layer 178 of carrier 176 with active surface 130 and conductive layers 132 and 174 oriented toward the carrier.

Figure 2M:
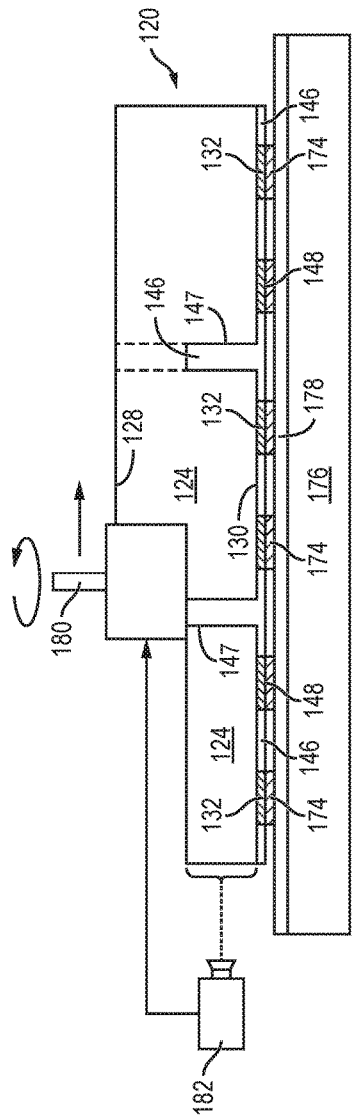

In FIG. 2m, grinder 180 removes a portion of substrate material 122 down to insulating material 146 in trench 144. Alternatively, a portion of substrate material 122 is removed by an etching process to expose insulating material 146 in trench 144. Semiconductor wafer 120, and correspondingly semiconductor die 124, are reduced in thickness by the amount of substrate material 122 that is removed. In one embodiment, grinder 180 is controlled by optical sensor or optical imager 182 to achieve the desired or optimal thickness of semiconductor wafer 120, e.g., 210 µm. Optical sensor 182 monitors the post-grind thickness of semiconductor wafer 120 and adjusts grinder 180 to maintain a planar, uniform, and accurate grinding operation. Although substrate material 122 has been removed to trenches 144, semiconductor die 124 are still held together by the cured insulating material 146 in the trenches.

Figure 2N:
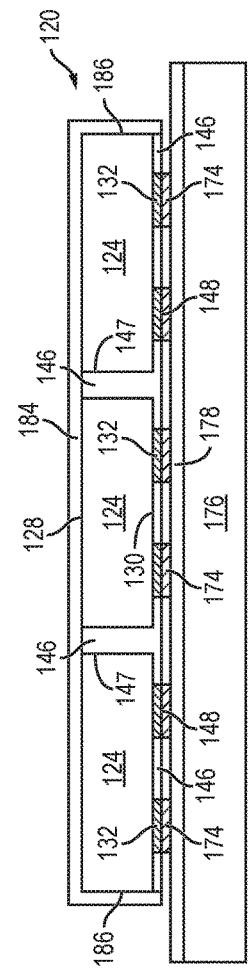

In FIG. 2n, an insulating layer 184 is formed over back surface 128 and side surfaces 186 of semiconductor wafer 120 using PVD, CVD, printing, lamination, spin coating, or spray coating. The insulating layer 184 contains one or more layers of SiO2, Si3N4, SiON, Ta2O5, Al2O3, or other material having similar insulating and structural properties. In one embodiment, insulating layer 184 is an LC type backside coating adhesive tape to protect and reinforce back surface 128 and side surfaces 186.

Figure 2O:
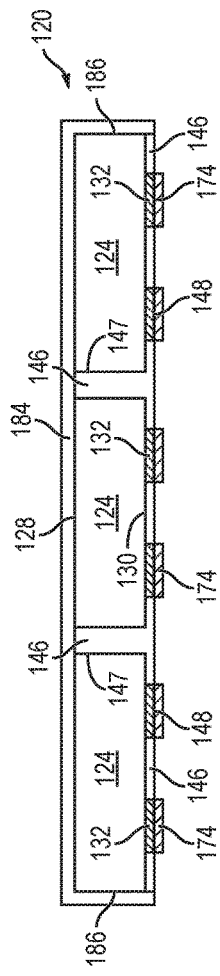

In FIG. 2o, carrier 176 and interface layer 178 are removed by chemical etching, mechanical peeling, CMP, mechanical grinding, thermal bake, UV light, laser scanning, or wet stripping, leaving semiconductor wafer 120 completely enclosed, i.e., all side surfaces 147 and 186, back surface 128, and active surface 130, by insulating material 146 or encapsulant 164 and insulating layer 184 with conductive layer 174 exposed for electrical interconnect. In addition, semiconductor die 124 can be laser marked.

In another embodiment, instead of applying insulating layer 184 in FIG. 2n, semiconductor wafer 120 with insulating material 146 is placed in cavity 190 of chase mold 192, as shown in FIG. 2p. A volume of encapsulant or molding compound 194 is injected into cavity 190, e.g., through inlet 196, under an elevated temperature and pressure over back surface 128 and around side surfaces 186 of semiconductor wafer 120. A vacuum 198 is drawn on port 200 during an auto-mold process to achieve an evenly dispersed, uniformly distributed, substantially void free encapsulant 194. Alternatively, semiconductor wafer 120 is compression molded with encapsulant 194 in chase mold 192 with vacuum assist. Encapsulant 194 can be a polymer composite material, such as epoxy resin with filler, epoxy acrylate with filler, or polymer with proper filler. Encapsulant 194 is non-conductive, provides physical support, and environmentally protects semiconductor die 124 from external elements, contaminants, and moisture. Encapsulant 194 also protects semiconductor die 124 from degradation due to exposure to light. Semiconductor wafer 120 is removed from chase mold 192 with encapsulant 194 over back surface 128 and around side surfaces 186 of semiconductor wafer 120, similar to FIG. 2o. A grinder removes excess encapsulant 194 to planarize the encapsulant, similar to FIG. 2h. Accordingly, semiconductor wafer 120 is completely enclosed, i.e., all side surfaces 147 and 186, back surface 128, and active surface 130, by insulating material 146 or encapsulant 164 and insulating layer 184 or encapsulant 194 with conductive layer 174 exposed for electrical interconnect. In addition, semiconductor die 124 can be laser marked.

In FIG. 2q, semiconductor wafer 120 is placed on dicing tape 202 and singulated through a center of insulating material 146 or encapsulant 164 in trench 144 using a saw blade or laser cutting tool 204 into individual semiconductor die 124. The width of saw blade or laser cutting tool 204 is less than a width of trench 144, leaving insulating material 146 or encapsulant 164 on side surfaces 147 and active surface 130, and insulating layer 184 or encapsulant 194 on side surfaces 186 and back surface 128 of each semiconductor die 124 to protect the side surfaces, active surface, and back surface of the semiconductor die. The singulated semiconductor die 124 are separated from dicing tape 202 using an ultrasonic tool and proceed to quality assurance and testing for functionality.

FIG. 3 shows semiconductor die 124 after singulation. Circuits on active surface 130 of semiconductor die 124 are electrically connected to conductive layers 132 and 174 for external interconnect. In one embodiment, semiconductor die 124 is a flipchip type die. Insulating material 146 or encapsulant 164 protects side surfaces 147 and active surface 130 of semiconductor die 124. Insulating layer 184 or encapsulant 194 covers side surfaces 186 and back surface 128 of semiconductor die 124. Accordingly, each semiconductor die 124 is completely enclosed, i.e. all side surfaces 147 and 186, back surface 128, and active surface 130, by insulating material 146 or encapsulant 164 and insulating layer 184 or encapsulant 194 with conductive layer 174 exposed for electrical interconnect.

Figure 4C:
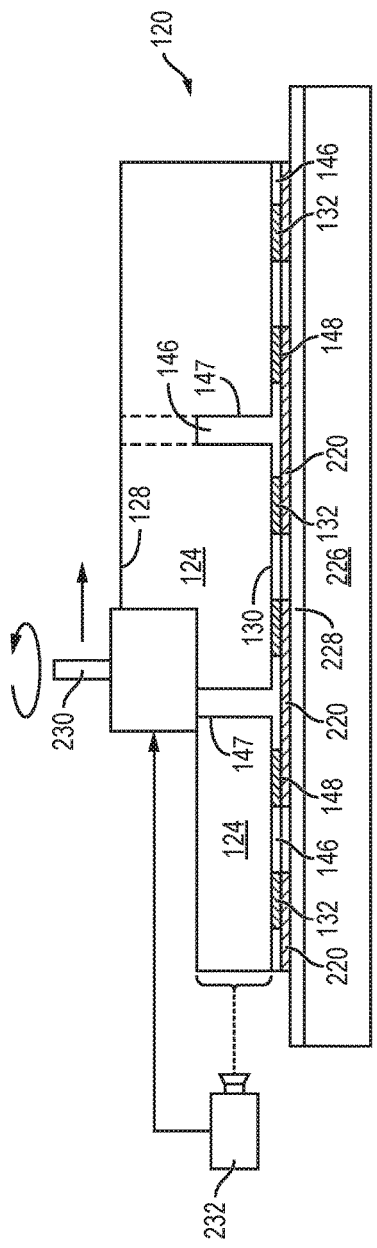

FIGS. 4a-4g show an alternate embodiment with a printed conductive layer formed over conductive layer 132 and insulating material 146. Continuing from FIG. 2h, surface 148 of conductive layer 132 is cleaned, and an electrically conductive layer 220 is formed over surface 148 of conductive layer 132 and insulating material 146 using a screen print, stencil print, or inkjet printing, as shown in FIG. 4a. In one embodiment, conductive layer 220 is printed with Ag ink to reduce parasitic capacitance and provide improved surface mount quality. The printing of conductive layer 220 allows formation of any shape electrode. Alternatively, conductive layer 220 can be one or more layers of Al, Cu, Sn, Ni, Au, Ag, Ti, SnAg, SnAgCu, CuNi, CuNiAu, CuSnAg, CuNiPdAu, or other suitable electrically conductive material formed with a lithographic process. Conductive layer 220 extends over trench 144 between portions of conductive layer 132 on opposite sides of the trench. Conductive layer 220 extends above insulating material 146 or encapsulant 164 and inhibits oxidation of conductive layer 132.

In FIG. 4b, carrier 140 and interface layer 142 are removed by chemical etching, mechanical peeling, CMP, mechanical grinding, thermal bake, UV light, laser scanning, or wet stripping. FIG. 4b further shows a cross-sectional view of a portion of a carrier or temporary substrate 226 containing sacrificial base material such as silicon, polymer, beryllium oxide, glass, or other suitable low-cost, rigid material for structural support. An interface layer or double-sided tape 228 is formed over carrier 226 as a temporary adhesive bonding film, etch-stop layer, or thermal release layer. Semiconductor wafer 120 is positioned over and mounted to interface layer 228 of carrier 226 with active surface 130 and conductive layers 132 and 220 oriented toward the carrier.

In FIG. 4c, grinder 230 removes a portion of substrate material 122 down to insulating material 146 in trench 144. Alternatively, a portion of substrate material 122 is removed by an etching process to expose insulating material 146 in trench 144. Semiconductor wafer 120, and correspondingly semiconductor die 124, are reduced in thickness by the amount of substrate material 122 that is removed. In one embodiment, grinder 230 is controlled by optical sensor or optical imager 232 to achieve the desired or optimal thickness of semiconductor wafer 120, e.g., 210 μm. Optical sensor 232 monitors the post-grind thickness of semiconductor wafer 120 and adjusts grinder 230 to maintain a planar, uniform, and accurate grinding operation. Although substrate material 122 has been removed to trenches 144, semiconductor die 124 are still held together by the cured insulating material 146 in the trenches.

Figure 4D:
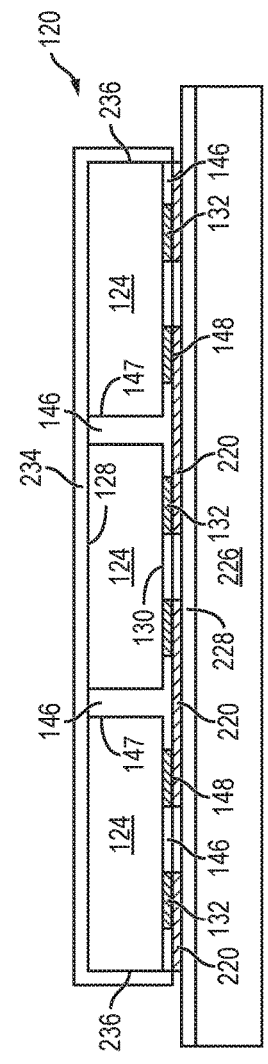

In FIG. 4d, an insulating layer 234 is formed over back surface 128 and side surfaces 236 of semiconductor wafer 120 using PVD, CVD, printing, lamination, spin coating, or spray coating. The insulating layer 234 contains one or more layers of SiO2, Si3N4, SiON, Ta2O5, Al2O3, or other material having similar insulating and structural properties. In one embodiment, insulating layer 234 is an LC type backside coating adhesive tape to protect and reinforce back surface 128 and side surfaces 236.

Figure 4E:
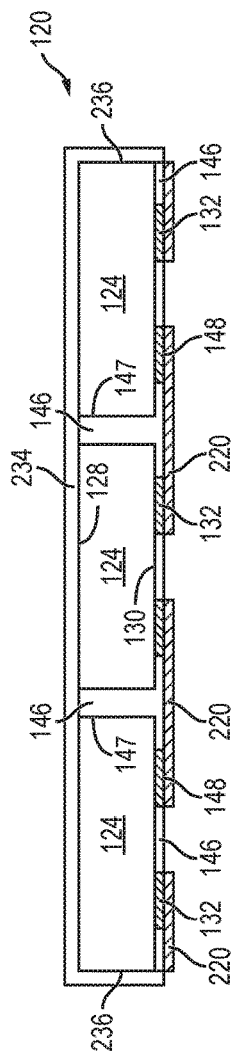

In FIG. 4e, carrier 226 and interface layer 228 are removed by chemical etching, mechanical peeling, CMP, mechanical grinding, thermal bake, UV light, laser scanning, or wet stripping, leaving semiconductor wafer 120 completely enclosed, i.e., all side surfaces 147 and 236, back surface 128, and active surface 130, by insulating material 146 or encapsulant 164 and insulating layer 234 with conductive layer 220 exposed for electrical interconnect. In addition, semiconductor die 124 can be laser marked.

Figure 4F:
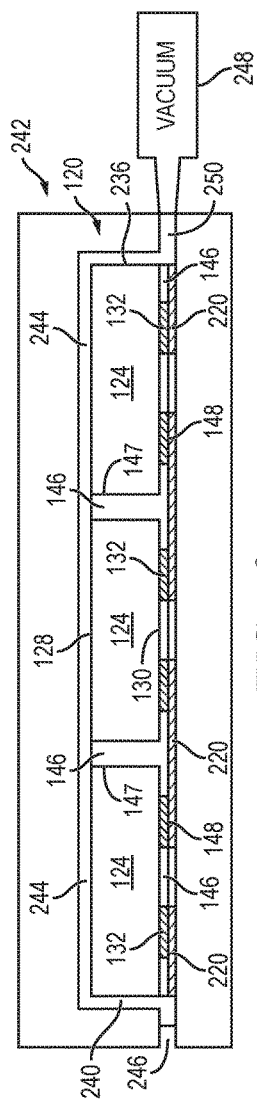

In another embodiment, instead of applying insulating layer 234 in FIG. 4d, semiconductor wafer 120 with insulating material 146 is placed in cavity 240 of chase mold 242, as shown in FIG. 4f. A volume of encapsulant or molding compound 244 is injected into cavity 240, e.g., through inlet 246, under an elevated temperature and pressure over back surface 128 and around side surfaces 236 of semiconductor wafer 120. A vacuum 248 is drawn on port 250 during an auto-mold process to achieve an evenly dispersed, uniformly distributed, substantially void free encapsulant 244. Alternatively, semiconductor wafer 120 is compression molded with encapsulant 244 in chase mold 242 with vacuum assist. Encapsulant 244 can be a polymer composite material, such as epoxy resin with filler, epoxy acrylate with filler, or polymer with proper filler. Encapsulant 244 is non-conductive, provides physical support, and environmentally protects semiconductor die 124 from external elements, contaminants, and moisture. Encapsulant 244 also protects semiconductor die 124 from degradation due to exposure to light. Semiconductor wafer 120 is removed from chase mold 242 with encapsulant 244 over back surface 128 and around side surfaces 236 of semiconductor wafer 120, similar to FIG. 4d. A grinder removes excess encapsulant 244 to planarize the encapsulant, similar to FIG. 2h. Accordingly, semiconductor wafer 120 completely enclosed, i.e., all side surfaces 147 and 236, back surface 128, and active surface 130, by insulating material 146 or encapsulant 164 and insulating layer 234 or encapsulant 244 with conductive layer 220 exposed for electrical interconnect. In addition, semiconductor die 124 can be laser marked.

Figure 4G:
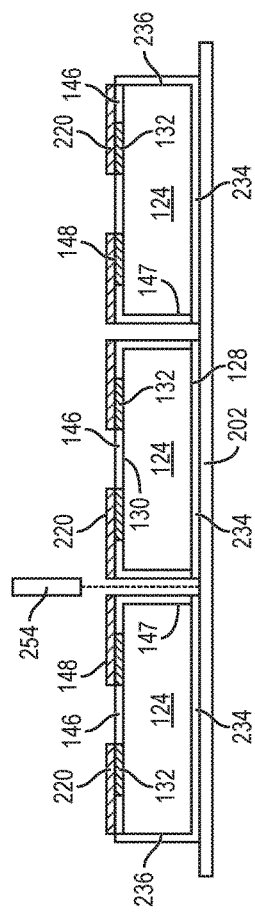

In FIG. 4g, semiconductor wafer 120 is placed on dicing tape 252 and singulated through a center of insulating material 146 or encapsulant 164 in trench 144 and conductive layer 220 using a saw blade or laser cutting tool 254 into individual semiconductor die 124. The width of saw blade or laser cutting tool 254 is less than a width of trench 144, leaving insulating material 146 or encapsulant 164 on side surfaces 147 and active surface 130, and insulating layer 234 or encapsulant 244 on side surfaces 236 and back surface 128 of each semiconductor die 124 to protect the side surfaces, active surface, and back surface of the semiconductor die. The singulated semiconductor die 124 are separated from dicing tape 252 using an ultrasonic tool and proceed to quality assurance and testing for functionality.

Figure 5:
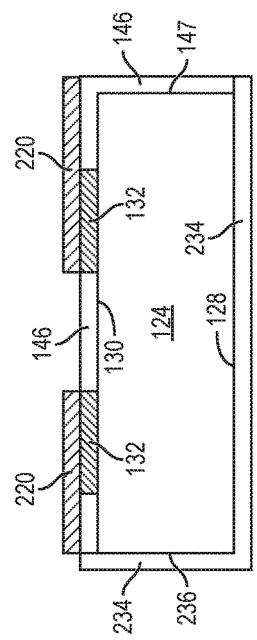
FIG. 5 illustrates a semiconductor die from the process flow of FIGS. 4a-4g.

FIG. 5 shows semiconductor die 124 after singulation. Circuits on active surface 130 of semiconductor die 124 are electrically connected to conductive layers 132 and 220 for external interconnect. In one embodiment, semiconductor die 124 is a flipchip type die. Insulating material 146 or encapsulant 164 protects side surfaces 147 and active surface 130 of semiconductor die 124. Insulating layer 234 or encapsulant 244 covers side surfaces 236 and back surface 128 of semiconductor die 124. Accordingly, each semiconductor die 124 is completely enclosed, i.e., all side surfaces 147 and 236, back surface 128, and active surface 130, by insulating material 146 or encapsulant 164 and insulating layer 234 or encapsulant 244 with conductive layer 220 exposed for electrical interconnect. Additional metal layers, e.g., Ni, Au, or Cu, can be formed over conductive layer 220 post singulation using a plating process suitable for soldering.

Figure 6A:
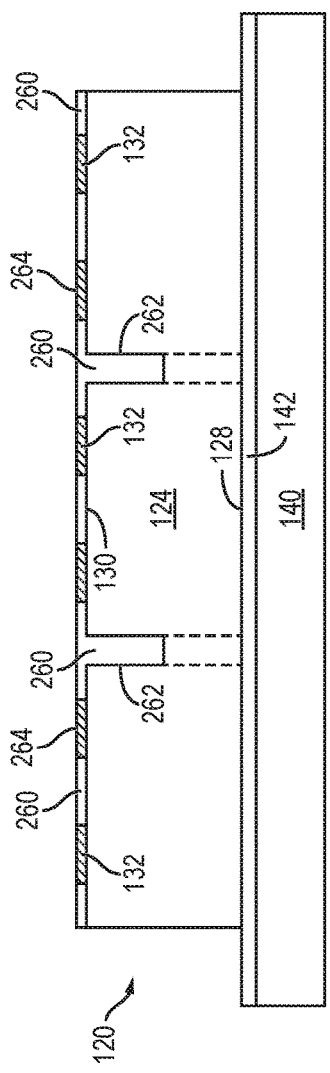

FIGS. 6a-6m show an alternate embodiment with a printed conductive layer formed over conductive layer 132 and insulating material 260 and into trench 144. Continuing from FIG. 2e, trench 144 is filled with an insulating material 260, such as an epoxy or polymer material, as shown in FIG. 6a. Insulating material 260 covers side surfaces 262 of semiconductor die 124 in trench 144 and further forms a layer over active surface 130. In another embodiment, insulating material 260 can be $SiO_2$, $Si_3N_4$, SiON, $Ta_2O_5$, $Al_2O_3$, or other material having similar insulating and structural properties. The layer of insulating material 260 extends to surface 264 of conductive layer 132, leaving surface 264 exposed, as shown in FIG. 6a. Insulating material 260 is cured to solidify and bond to active surface 130 and side surfaces 262 of semiconductor die 124.

Figure 6B:
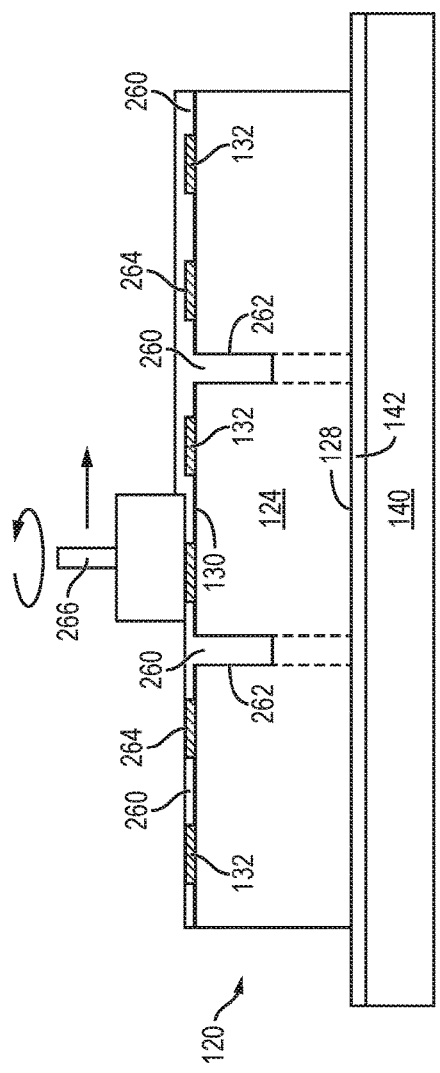

In another embodiment, the layer of insulating material 260 is sufficiently thick to cover surface 264 of conductive layer 132, as shown in FIG. 6b. In this case, grinder 266 removes excess insulating material 260 to planarize the insulating material and expose surface 264 of conductive layer 132.

In another embodiment, instead of applying insulating material 260 in FIG. 6a or 6b, semiconductor wafer 120 is removed from carrier 140 and placed in cavity 270 of chase mold 272, as shown in FIG. 6c. A volume of encapsulant or molding compound 274 is injected into cavity 270, e.g., through inlet 276, under an elevated temperature and pressure over active surface 130 and into trench 144 of semiconductor wafer 120. A vacuum 278 is drawn on port 280 during an auto-mold process to achieve an evenly dispersed, uniformly distributed, substantially void free encapsulant 274. Alternatively, semiconductor wafer 120 is compression molded with encapsulant 274 in chase mold 272 with vacuum assist. Encapsulant 274 can be a polymer composite material, such as epoxy resin with filler, epoxy acrylate with filler, or polymer with proper filler. Encapsulant 274 is non-conductive, provides physical support, and environmentally protects semiconductor die 124 from external elements, contaminants, and moisture. Encapsulant 274 also protects semiconductor die 124 from degradation due to exposure to light. Semiconductor wafer 120 is removed from chase mold 272 with encapsulant 274 disposed over active surface 130 and into trench 144 of semiconductor wafer 120. In FIG. 6d, grinder 282 removes excess encapsulant 274 to planarize the encapsulant and expose surface 264 of conductive layer 132.

Figure 6E:
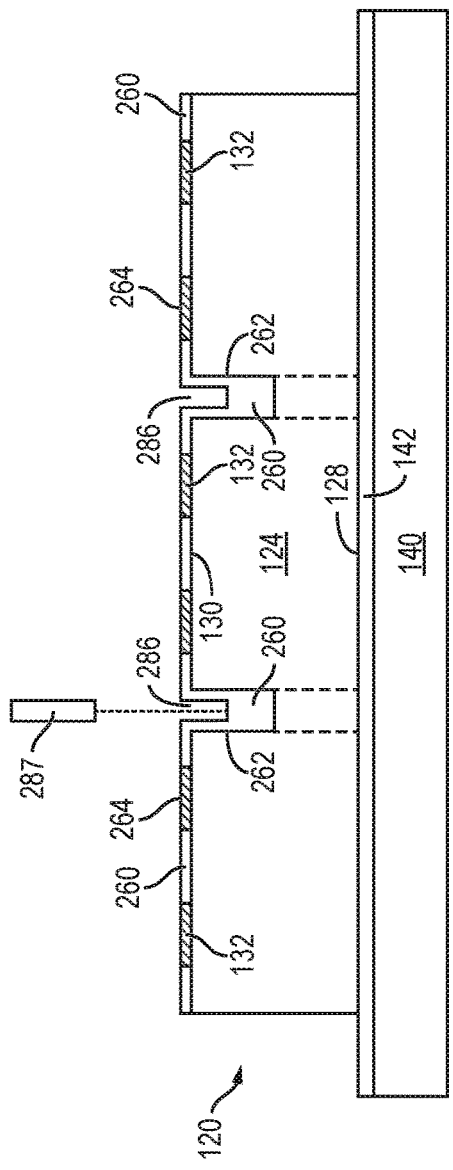

Accordingly, the insulating material disposed over active surface 130 and into trench 144 can be insulating material 260 as in FIG. 6a or 6b, or encapsulant 274 as in FIG. 6d. The following description is provided in terms of insulating material 260, but also applies to the embodiment with encapsulant 274. Returning to FIG. 6a, a trench 286 is formed in a central region of insulating material 260 in trench 144 partially but not completely through the insulating material using a saw blade or laser cutting tool 287, DRIE, or other suitable cutting process, as shown in FIG. 6e. In one embodiment, trench 286 has a depth of, for example, 100-150 µm for trench 144 depth of 210 µm. Alternatively, trench 286 has a depth of 0.10-0.50 of the depth of trench 144.

Figure 6F:
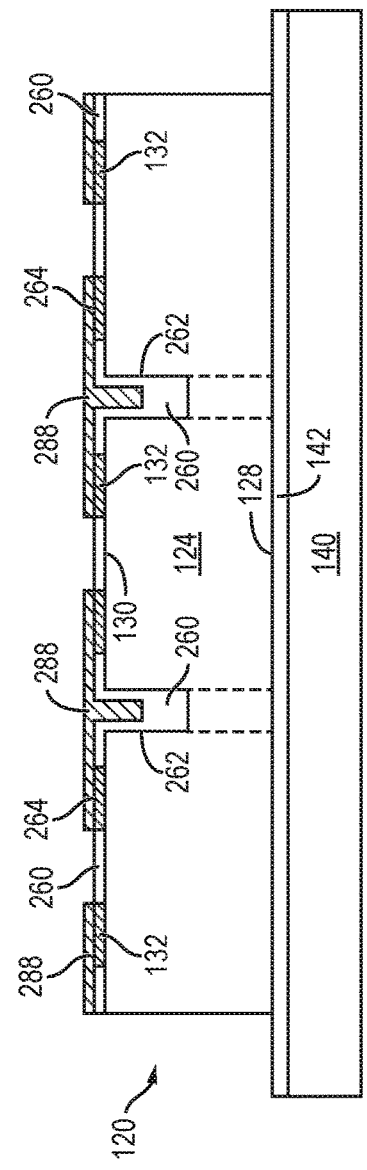

In FIG. 6f, surface 264 of conductive layer 132 is cleaned, and an electrically conductive layer 288 is formed over surface 264 of conductive layer 132 and into trench 286 over insulating material 260. In one embodiment, conductive layer 288 is printed with Ag ink to reduce parasitic capacitance and provide improved surface mount quality. The printing of conductive layer 288 allows formation of any shape electrode. Alternatively, conductive layer 288 can be one or more layers of Al, Cu, Sn, Ni, Au, Ag, Ti, SnAg, SnAgCu, CuNi, CuNiAu, CuSnAg, CuNiPdAu, or other suitable electrically conductive material formed with a lithographic process. In one embodiment, conductive layer 288 is Ni, Au, or Ni/Au alloy. Conductive layer 288 extends over trench 144 between portions of conductive layer 132 on opposite sides of trench 144, and into trench 286. Conductive layer 288 extends above insulating material 260 or encapsulant 274 and inhibits oxidation of conductive layer 132.

Figure 6G:
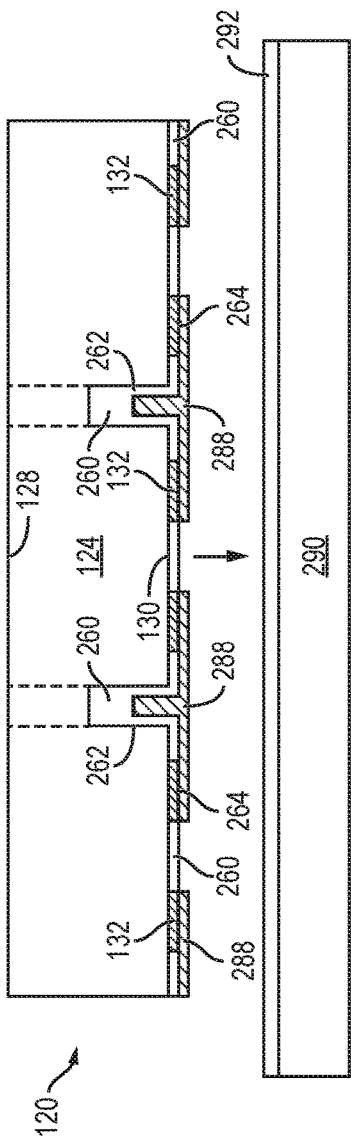

In FIG. 6g, carrier 140 and interface layer 142 are removed by chemical etching, mechanical peeling, CMP, mechanical grinding, thermal bake, UV light, laser scanning, or wet stripping. FIG. 6g further shows a cross-sectional view of a portion of a carrier or temporary substrate 290 containing sacrificial base material such as silicon, polymer, beryllium oxide, glass, or other suitable low-cost, rigid material for structural support. An interface layer or double-sided tape 292 is formed over carrier 290 as a temporary adhesive bonding film, etch-stop layer, or thermal release layer. Semiconductor wafer 120 is positioned over and mounted to interface layer 292 of carrier 290 with active surface 130 and conductive layers 132 and 288 oriented toward the carrier.

Figure 6H:
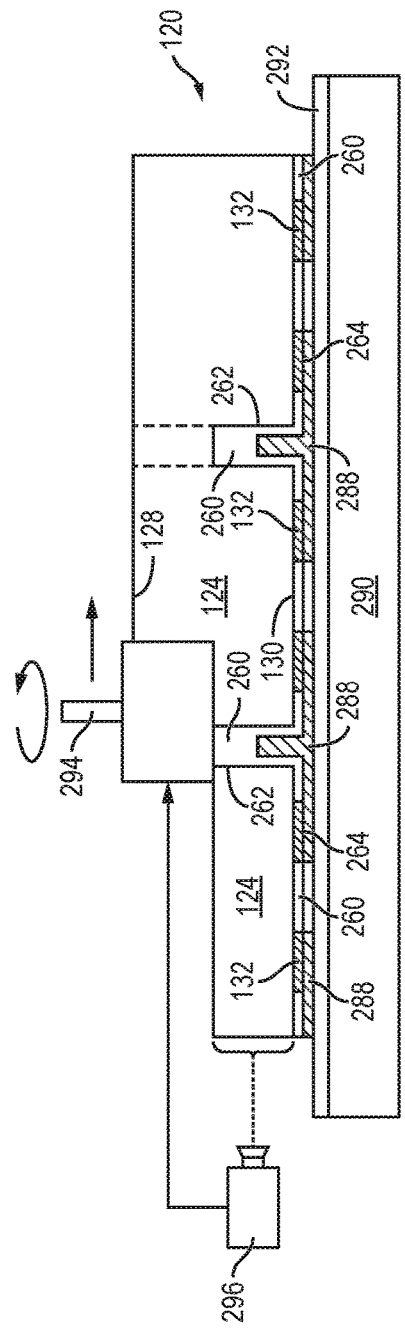

In FIG. 6h, grinder 294 removes a portion of substrate material 122 down to insulating material 260 in trench 144. Alternatively, a portion of substrate material 122 is removed by an etching process to expose insulating material 260 in trench 144. Semiconductor wafer 120, and correspondingly semiconductor die 124, are reduced in thickness by the amount of substrate material 122 that is removed. In one embodiment, grinder 294 is controlled by optical sensor or optical imager 296 to achieve the desired or optimal thickness of semiconductor wafer 120, e.g., 210 µm. Optical sensor 296 monitors the post-grind thickness of semiconductor wafer 120 and adjusts grinder 294 to maintain a planar, uniform, and accurate grinding operation. Although substrate material 122 has been removed to trenches 144, semiconductor die 124 are still held together by the cured insulating material 260 in the trenches.

Figure 6I:
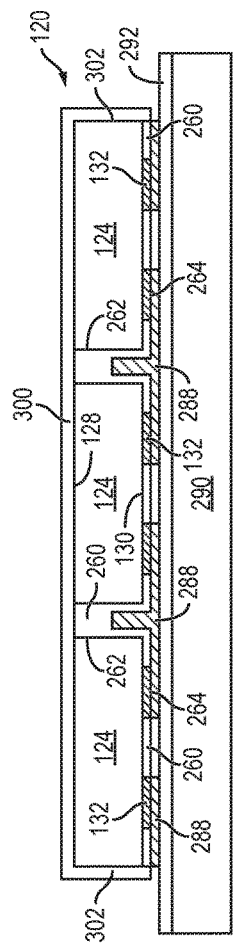

In FIG. 6i, an insulating layer 300 is formed over back surface 128 and side surfaces 302 of semiconductor wafer 120 using PVD, CVD, printing, lamination, spin coating, or spray coating. The insulating layer 300 contains one or more layers of SiO2, Si3N4, SiON, Ta2O5, Al2O3, or other material having similar insulating and structural properties. In one embodiment, insulating layer 300 is an LC type backside coating adhesive tape to protect and reinforce back surface 128 and side surfaces 302.

Figure 6J:
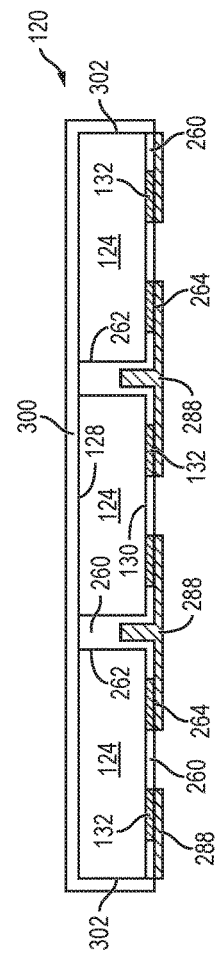

In FIG. 6j, carrier 290 and interface layer 292 are removed by chemical etching, mechanical peeling, CMP, mechanical grinding, thermal bake, UV light, laser scanning, or wet stripping, leaving semiconductor wafer 120 completely enclosed, i.e. all side surfaces 262 and 302, back surface 128, and active surface 130, by insulating material 260 or encapsulant 274 and insulating layer 300 with conductive layer 288 exposed for electrical interconnect. In addition, semiconductor die 124 can be laser marked.

Figure 6K:
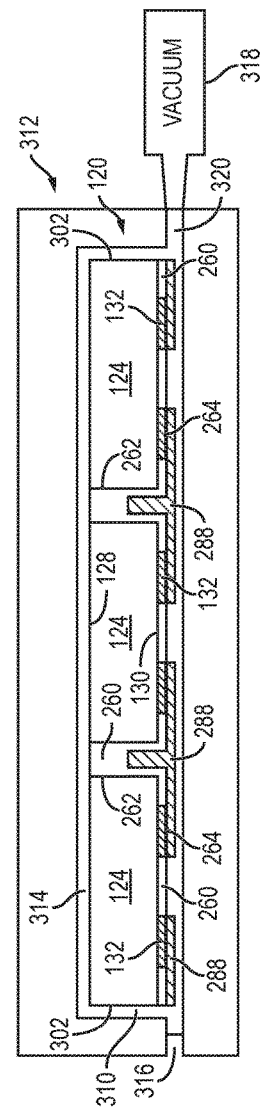

In another embodiment, instead of applying insulating layer 300 in FIG. 6i, semiconductor wafer 120 with insulating material 260 is placed in cavity 310 of chase mold 312, as shown in FIG. 6k. A volume of encapsulant or molding compound 314 is injected into cavity 310, e.g., through inlet 316, under an elevated temperature and pressure over back surface 128 and around side surfaces 302 of semiconductor wafer 120. A vacuum 318 is drawn on port 320 during an auto-mold process to achieve an evenly dispersed, uniformly distributed, substantially void free encapsulant 314. Alternatively, semiconductor wafer 120 is compression molded with encapsulant 314 in chase mold 312 with vacuum assist. Encapsulant 314 can be a polymer composite material, such as epoxy resin with filler, epoxy acrylate with filler, or polymer with proper filler. Encapsulant 314 is non-conductive, provides physical support, and environmentally protects semiconductor die 124 from external elements, contaminants, and moisture. Encapsulant 314 also protects semiconductor die 124 from degradation due to exposure to light. Semiconductor wafer 120 is removed from chase mold 312 with encapsulant 314 over back surface 128 and around side surfaces 302 of semiconductor wafer 120, as shown in FIG. 6l. A grinder removes excess encapsulant 314 to planarize the encapsulant, similar to FIG. 2j. Accordingly, semiconductor wafer 120 completely enclosed, i.e., all side surfaces 262 and 302, back surface 128, and active surface 130, by insulating material 260 or encapsulant 274 and insulating layer 300 or encapsulant 314 with conductive layer 288 exposed for electrical interconnect. In addition, semiconductor die 124 can be laser marked.

In FIG. 6m, semiconductor wafer 120 is placed on dicing tape 322 and singulated through a center of conductive layer 288 and insulating material 260 in trench 144 using a saw blade or laser cutting tool 324 into individual semiconductor die 124. The width of saw blade or laser cutting tool 324 is less than a width of trench 286, leaving conductive layer 288 and insulating material 260 or encapsulant 274 on side surfaces 262 and active surface 130, and insulating layer 300 or encapsulant 314 on side surfaces 302 and back surface 128 of each semiconductor die 124 to protect the side surfaces, active surface, and back surface of the semiconductor die. The singulated semiconductor die 124 are separated from dicing tape 322 using an ultrasonic tool and proceed to quality assurance and testing for functionality.

FIG. 7 shows semiconductor die 124 after singulation. Circuits on active surface 130 of semiconductor die 124 are electrically connected to conductive layers 132 and 288 for external interconnect. In one embodiment, semiconductor die 124 is a flipchip type die. Insulating material 260 or encapsulant 274 protects side surfaces 262 and active surface 130 of semiconductor die 124. Insulating layer 300 or encapsulant 314 covers side surfaces 302 and back surface 128 of semiconductor die 124. Accordingly, each semiconductor die 124 is completely enclosed, i.e., all side surfaces 262 and 302, back surface 128, and active surface 130, by insulating material 260 or encapsulant 274 and insulating layer 300 or encapsulant 314 with conductive layer 174 exposed for electrical interconnect. Additional metal layers, e.g., Ni, Au, or Cu, can be formed over conductive layer 288 post singulation using a plating process suitable for soldering.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer including a plurality of contact pads formed over a first surface of the semiconductor wafer;
   forming a first trench into the first surface of the semiconductor wafer;
   disposing an insulating material over the first surface of the semiconductor wafer and into the first trench, wherein the contact pads are exposed from the insulating material and the insulating material includes a planar section extending across the first trench from a first contact pad of the plurality of contact pads to a second contact pad of the plurality of contact pads;
   forming a conductive layer extending on the planar section of the insulating material from the first contact pad to the second contact pad;
   backgrinding a second surface of the semiconductor wafer to expose the insulating material in the first trench;
   forming an insulating layer over the second surface of the semiconductor wafer; and
   singulating the semiconductor wafer through the first trench to separate the semiconductor wafer into a plurality of semiconductor die.

2. The method of claim 1, wherein the insulating material and insulating layer enclose the semiconductor die.

3. The method of claim 1, further including forming the conductive layer by a printing process.

4. The method of claim 1, further including:
   forming a second trench in the insulating material in the first trench;
   forming the conductive layer into the second trench; and
   singulating the semiconductor wafer through the conductive layer in the second trench and the insulating material.

5. The method of claim 1, further including:
   disposing the insulating material over the first surface of the semiconductor wafer and into the first trench by a first molding process; and
   forming the insulating layer over the second surface of the semiconductor wafer by a second molding process.

6. The method of claim 1, further including singulating the semiconductor wafer through the insulating material in the first trench after backgrinding the semiconductor wafer.

7. A method of making a semiconductor device, comprising:
   providing a semiconductor wafer including a plurality of semiconductor die and a plurality of contact pads formed over a first surface of the semiconductor wafer, wherein the contact pads each include a flat upper surface and a nickel plating formed over the flat upper surface;
   forming a first trench into the first surface of the semiconductor wafer;
   disposing an insulating material over the first surface of the semiconductor wafer and into the first trench, wherein the flat upper surfaces of the contact pads are exposed from the insulating material and the insulating material includes a planar section extending across the first trench from a first contact pad of the plurality of contact pads to a second contact pad of the plurality of contact pads;
   forming a conductive layer extending on the planar section of the insulating material from the first contact pad to the second contact pad over the first trench; and
   forming an insulating layer over a second surface of the semiconductor wafer.

8. The method of claim 7, further including:
   removing a portion of the semiconductor wafer opposite the first surface of the semiconductor wafer to the insulating material in the first trench; and
   singulating the semiconductor wafer through the insulating material in the first trench to separate the semiconductor die.

9. The method of claim 8, wherein the insulating material and insulating layer enclose the semiconductor die.

10. The method of claim 7, further including singulating the semiconductor wafer through the conductive layer.

11. The method of claim 10, further including forming the conductive layer by a printing process.

12. The method of claim 7, further including:
    forming a second trench in the insulating material in the first trench;
    forming the conductive layer into the second trench; and
    singulating the semiconductor wafer through the conductive layer in the second trench and the insulating material to separate the semiconductor die.

13. The method of claim 7, further including forming the insulating layer with a molding process.

14. A method of making a semiconductor device, comprising:
    providing a semiconductor wafer including a contact pad with a flat upper surface formed on the semiconductor wafer;
    forming a first trench into a first surface of the semiconductor wafer;
    disposing an insulating material over the first surface of the semiconductor wafer and into the first trench, wherein the insulating material covers the flat upper surface of the contact pad;
    planarizing the insulating material to expose the flat upper surface of the contact pad, wherein the insulating material includes a planar section extending across the first trench from the contact pad to a second contact pad after planarizing;
    forming a conductive layer extending on the planar section of the insulating material from the contact pad to the second contact pad; and
    forming an insulating layer over a second surface of the semiconductor wafer.

15. The method of claim 14, further including forming the conductive layer by a printing process.

16. The method of claim 14, further including:
    forming a second trench in the insulating material in the first trench;
    forming the conductive layer into the second trench; and
    singulating the semiconductor wafer through the conductive layer in the second trench and the insulating material.

17. The method of claim 14, further including:
    removing a portion of the semiconductor wafer opposite the first surface of the semiconductor wafer to the insulating material in the first trench; and
    singulating the semiconductor wafer through the insulating material in the first trench.

18. The method of claim 14, further including forming the insulating layer with a molding process.

19. A semiconductor device, comprising:
    a semiconductor wafer including a first trench formed into a first surface of the semiconductor wafer between a first contact pad and a second contact pad of the semiconductor wafer;

an insulating material disposed over the first surface of the semiconductor wafer and into the first trench, wherein the insulating material includes a planar section extending across the first trench from the first contact pad to the second contact pad;

a conductive layer extending on the planar section of the insulating material from the first contact pad to the second contact pad; and an insulating layer formed over a second surface of the semiconductor wafer and contacting the insulating material.

20. The semiconductor device of claim 19, wherein the insulating material or insulating layer includes an encapsulant.

21. The semiconductor device of claim 19, wherein the first contact pad and second contact pad include a nickel plating coplanar with the planar section of the insulating material.

22. The semiconductor device of claim 19, wherein the conductive layer includes a flat surface that extends for an entire footprint of the conductive layer.

23. The semiconductor device of claim 22, wherein the flat surface is oriented toward the semiconductor wafer.

* * * * *